US012577508B2

(12) United States Patent
Hayashi et al.

(10) Patent No.: US 12,577,508 B2
(45) **Date of Patent: *Mar. 17, 2026**

(54) COMPOSITION, AND METHOD FOR CLEANING ADHESIVE POLYMER

(71) Applicant: SHOWA DENKO K.K., Tokyo (JP)

(72) Inventors: Kotaro Hayashi, Tokyo (JP); Susumu Nakazaki, Tokyo (JP)

(73) Assignee: Resonac Corporation, Tokyo (JP)

( * ) Notice: Subject to any disclaimer, the term of this patent is extended or adjusted under 35 U.S.C. 154(b) by 753 days.

This patent is subject to a terminal disclaimer.

(21) Appl. No.: 17/791,070

(22) PCT Filed: Mar. 24, 2021

(86) PCT No.: PCT/JP2021/012376

§ 371 (c)(1),
(2) Date: Jul. 6, 2022

(87) PCT Pub. No.: WO2021/205885

PCT Pub. Date: Oct. 14, 2021

(65) Prior Publication Data

US 2023/0039366 A1 Feb. 9, 2023

(30) Foreign Application Priority Data

Apr. 9, 2020 (JP) ................................. 2020-070543

(51) Int. Cl.

| | |
|---|---|
| ***C11D 3/30*** | (2006.01) |
| ***C11D 3/20*** | (2006.01) |
| ***C11D 3/24*** | (2006.01) |
| ***C11D 3/28*** | (2006.01) |
| ***C11D 7/50*** | (2006.01) |
| *H01L 21/02* | (2006.01) |
| *H01L 21/304* | (2006.01) |

(52) U.S. Cl.

CPC .......... *C11D 7/5013* (2013.01); *C11D 3/2068* (2013.01); *C11D 3/245* (2013.01); *C11D 3/28* (2013.01); *C11D 2111/22* (2024.01); *H01L 21/02057* (2013.01); *H01L 21/02079* (2013.01); *H01L 21/304* (2013.01)

(58) Field of Classification Search

CPC ......... C11D 3/28; C11D 3/245; C11D 3/2068; C11D 3/2079

USPC ........ 510/175, 176, 178, 477, 488, 500, 505

See application file for complete search history.

(56) References Cited

U.S. PATENT DOCUMENTS

| | | | | |
|---|---|---|---|---|
| 6,652,665 | B1 | 11/2003 | Sachdev et al. | |
| 11,781,092 | B2 * | 10/2023 | Hayashi ............ | H01L 21/02057 510/200 |
| 2003/0148904 | A1 | 8/2003 | Moore | |
| 2004/0137736 | A1 * | 7/2004 | Daviot ................. | C11D 7/3227 438/690 |
| 2007/0066502 | A1 * | 3/2007 | Brainard ................. | G03F 7/426 510/175 |
| 2009/0082240 | A1 * | 3/2009 | Nukui ..................... | G03F 7/425 510/176 |
| 2014/0336093 | A1 | 11/2014 | Koellnberger | |
| 2016/0032186 | A1 * | 2/2016 | Chen ....................... | G03F 7/423 252/79.3 |
| 2017/0015955 | A1 * | 1/2017 | Oie .......................... | C11D 7/12 |
| 2017/0081622 | A1 * | 3/2017 | Inaoka .............. | H01L 21/02068 |
| 2018/0291309 | A1 * | 10/2018 | Frye ....................... | C11D 3/361 |
| 2019/0171102 | A1 | 6/2019 | Kamimura et al. | |

FOREIGN PATENT DOCUMENTS

| | | | | |
|---|---|---|---|---|
| EP | 1035446 | A2 * | 9/2000 | ......... C11D 11/0047 |
| EP | 1701218 | A2 * | 9/2006 | ............. C09K 13/08 |
| JP | 2004-000969 | A | 1/2004 | |
| JP | 2004-361433 | A | 12/2004 | |
| JP | 2014-133855 | A | 7/2014 | |
| JP | 2015-505886 | A | 2/2015 | |
| KR | 10-2016-0073288 | A | 6/2016 | |
| KR | 10-2019-0032511 | A | 3/2019 | |
| WO | 2006/110645 | A2 | 10/2006 | |
| WO | WO-2007120259 | A2 * | 10/2007 | ......... C11D 11/0047 |
| WO | WO-2012009639 | A2 * | 1/2012 | ......... C11D 11/0041 |
| WO | 2018/043690 | A1 | 3/2018 | |

OTHER PUBLICATIONS

International Search Report for PCT/JP2021/012376 dated Jun. 22, 2021.

* cited by examiner

*Primary Examiner* — Gregory R Delcotto
(74) *Attorney, Agent, or Firm* — Sughrue Mion, PLLC

(57) ABSTRACT

The present invention provides a composition which is suppressed in decrease of the etching rate over time. A composition which contains; at least one of a quaternary alkyl ammonium fluoride and a hydrate of a quaternary alkyl ammonium fluoride; (A) an N-substituted amide compound that has no active hydrogen on a nitrogen atom and (B) a dipropylene glycol dimethyl ether, which serve as aprotic solvents; and an antioxidant.

9 Claims, No Drawings

COMPOSITION, AND METHOD FOR CLEANING ADHESIVE POLYMER

CROSS REFERENCE TO RELATED APPLICATIONS

This application is a National Stage of International Application No. PCT/JP2021/012376 filed Mar. 24, 2021, claiming priority based on Japanese Patent Application No. 2020-070543 filed Apr. 9, 2020.

FIELD

The present invention relates to a composition, and a method for cleaning an adhesive polymer. One embodiment of the present invention relates to a composition that can be used for decomposing and cleaning an adhesive including an adhesive polymer used for temporary bonding between a device wafer and a support wafer (carrier wafer), the adhesive remaining on the device wafer in a thinning process of a semiconductor wafer, and a method for cleaning the adhesive polymer using the composition.

BACKGROUND

In a three-dimensional mounting technology for densifying semiconductors, the thicknesses per sheet of semiconductor wafers are reduced, and a plurality of semiconductor wafers connected by a through silicon via (TSV) are stacked. Specifically, after thinning a device wafer having a semiconductor device formed thereon by polishing a surface (back surface) on which the semiconductor device is not formed, an electrode including a TSV is formed on the back surface.

In the polishing step of the back surface of the device wafer, in order to impart mechanical strength to the device wafer, a support wafer, also referred to as a carrier wafer, is temporarily bonded using an adhesive on a surface on which the semiconductor device is formed of the device wafer. For example, a glass wafer or a silicon wafer is used as the support wafer. After the polishing step, a metal wiring or an electrode pad containing Al, Cu, Ni, Au, etc., an inorganic film, such as an oxide film or a nitride film, or a resin layer containing a polyimide, etc., is formed on the polished surface (back surface) of the device wafer, as necessary. Thereafter, the device wafer is fixed to a tape, which has an acrylic adhesive layer and is secured by a ring frame, by attaching the back surface of the device wafer to the tape. The device wafer is then separated from the support wafer (debonding), the adhesive on the device wafer is peeled off, and the adhesive residue on the device wafer is cleaned off using a cleaning agent.

An adhesive including a polyorganosiloxane compound having good heat resistance as an adhesive polymer is used for temporary bonding application of a device wafer. In particular, when the adhesive is a crosslinked polyorganosiloxane compound, two actions of cleavage of an Si—O bond and dissolution of a decomposed product by a solvent are required for a cleaning agent. Examples of such a cleaning agent include those obtained by dissolving a fluorine-based compound, such as tetrabutylammonium fluoride (TBAF) in a polar aprotic solvent. Since a fluoride ion of TBAF participates in the cleavage of an Si—O bond via Si—F bond formation, the cleaning agent can be provided with etch performance. Since the polar aprotic solvent can dissolve TBAF and does not form solvation via a hydrogen bonding with the fluoride ion, the reactivity of the fluoride ion can be increased.

Patent Literature 1 (JP2014-133855 A) describes cleaning liquids for a siloxane resin in which tetraalkylammonium hydroxide is dissolved in a polar aprotic solvent.

Patent Literature 2 (JP 2015-505886 A) describes cleaning liquids for polysiloxane in which TBAF is dissolved in an ester or a ketone.

Patent Literature 3 (JP 2004-000969 A) describes cleaning liquids in which TBAF is dissolved in propylene glycol alkyl ether alkoate.

CITATION LIST

Patent Literature

[PTL 1] JP 2014-133855 A
[PTL 2] JP 2015-505886 A
[PTL 3] JP 2004-000969 A

SUMMARY

Technical Problem

It is considered that the role of a solvent in a cleaning agent containing a fluorine compound, such as TBAF, and the solvent is to sufficiently dissolve the fluorine compound which is highly polar and a reactive substance, thereby making the affinity of the fluorine compound for a surface of a less polar adhesive sufficient to ensure reactivity of fluoride ions included in the fluorine compound, and to dissolve a decomposed product of the adhesive.

In some cases, a substituent is introduced into an adhesive polymer contained in an adhesive for the purpose of improving heat resistance, releasability, etc., whereby the surface of the adhesive may exhibit various polarities. It is desired that the cleaning agent exhibit excellent affinity for the surface of the adhesive exhibiting such various polarities, thereby achieving a high etch rate.

The present inventors have found that, even when an aprotic N-substituted amide compound and dipropylene glycol dimethyl ether are used as the solvent in order to dissolve a decomposition product of the adhesive while ensuring the reactivity of fluoride ions included in the fluorine compound, the etch rate of the composition may decrease with the lapse of the storage period after preparation of the composition.

The present invention provides a composition in which a decrease in the etch rate with time is suppressed.

Solution to Problem

The present inventors have found that a decrease in etch rate with time can be suppressed by using a composition containing a quaternary alkylammonium fluoride or a hydrate thereof, an N-substituted amide compound having no active hydrogen on a nitrogen atom, dipropylene glycol dimethyl ether, and an antioxidant.

That is, the present invention includes the following [1] to [11].

[1] A composition comprising at least one of a quaternary alkylammonium fluoride and a hydrate of a quaternary alkylammonium fluoride; (A) an N-substituted amide compound having no active hydrogen on a nitrogen atom, and (B) dipropylene glycol dimethyl ether, as an aprotic solvent; and an antioxidant.

[2] The composition according to [1], wherein the antioxidant comprises at least one selected from the group consisting of dibutylhydroxytoluene (BHT), butylhydroxyanisole (BHA), and ascorbic acid.

[3] The composition according to [1] or [2], wherein the content of the antioxidant is 10 ppm by mass to 1,000 ppm by mass.

[4] The composition according to any one of [1] to [3], wherein the (A) N-substituted amide compound is a 2-pyrrolidone derivative compound represented by the formula (1):

(1)

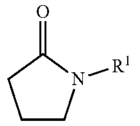

wherein, in the formula (1), $R^1$ represents an alkyl group having 1 to 4 carbon atoms.

[5] The composition according to [4], wherein the (A) N-substituted amide compound is a 2-pyrrolidone derivative compound wherein $R^1$ in the formula (1) is a methyl group or an ethyl group.

[6] The composition according to any one of [1] to [5], wherein the content of the quaternary alkylammonium fluoride is 0.01 to 10% by mass.

[7] The composition according to any one of [1] to [6], wherein the quaternary alkylammonium fluoride is a tetraalkylammonium fluoride represented by the formula (2):

$$R^2R^3R^4R^5N^+F^- \quad (2)$$

wherein, in the formula (2), $R^2$ to $R^5$ each independently represent an alkyl group selected from the group consisting of a methyl group, an ethyl group, an n-propyl group, an isopropyl group, and an n-butyl group.

[8] The composition according to any one of [1] to [7], wherein the content of the (A) N-substituted amide compound is 50 to 95% by mass and the content of (B) dipropylene glycol dimethyl ether is 5 to 50% by mass, with respect to 100% by mass of the aprotic solvent.

[9] The composition according to any one of [1] to [8], which is a decomposing cleaning composition for an adhesive polymer.

[10] The composition according to [9], wherein the adhesive polymer is a polyorganosiloxane compound.

[11] A method for cleaning an adhesive polymer on a substrate by using the composition according to any one of [1] to [10].

Advantageous Effects of Invention

The composition according to the present invention can suppress a decrease in etch rate with time. This is advantageous for long-term storage of the composition.

The foregoing description should not be considered as disclosing all embodiments of the present invention and all advantages thereof.

DESCRIPTION OF EMBODIMENTS

Hereinafter, the present invention will be described in further detail with reference to exemplary embodiments.

[Composition]

A composition according to one embodiment comprises at least one of a quaternary alkylammonium fluoride and a hydrate of a quaternary alkylammonium fluoride; (A) an N-substituted amide compound having no active hydrogen on a nitrogen atom, and (B) dipropylene glycol dimethyl ether (DPGDME), as an aprotic solvent; and an antioxidant.

A composition according to one embodiment contains an N-substituted amide compound having no active hydrogen on a nitrogen atom, i.e., no hydrogen atom is directly bonded to a nitrogen atom, (also simply referred to as "N-substituted amide compound") as a solvent. It is known that the N-substituted amide compound is gradually oxidized by contact with oxygen to produce an oxide. For example, N-methylpyrrolidone (NMP) is oxidized to generate NMP derivatives, including N-methylsuccinimide. Since this oxidation product of the N-substituted amide compound generates a product having a hydrogen atom which is active against fluoride ions in the composition, it is considered that the activity of the fluoride ion is deteriorated, and as a result, the etch rate decreases with time. Therefore, it is considered that suppressing the oxidation of the N-substituted amide compound is desirable in order to maintain the etch rate.

<Quaternary Alkylammonium Fluoride and Hydrate Thereof>

The quaternary alkylammonium fluoride and a hydrate thereof releases a fluoride ion which is involved in cleavage of an Si—O bond. A quaternary alkylammonium moiety can allow the quaternary alkylammonium fluoride, which is a salt, to dissolve in an aprotic solvent. As the quaternary alkylammonium fluoride, various compounds can be used without any particular limitation. Examples of the hydrate of the quaternary alkylammonium fluoride include trihydrates, tetrahydrates, and pentahydrates. The quaternary alkylammonium fluoride may be one or a combination of two or more thereof. The non-hydrate and hydrate of the quaternary alkylammonium fluoride can be used in any ratio.

In one embodiment, the quaternary alkylammonium fluoride is a tetraalkylammonium fluoride represented by the formula (2):

$$R^2R^3R^4R^5N^+F^- \quad (2)$$

wherein, in the formula (2), $R^2$ to $R^5$ each independently represent an alkyl group selected from the group consisting of a methyl group, an ethyl group, an n-propyl group, an isopropyl group, and an n-butyl group. From the viewpoint of availability, it is preferable that all $R^2$ to $R^5$ be the same alkyl group. Examples of such a quatemary alkylammonium fluoride include tetramethylammonium fluoride, tetraethylammonium fluoride, tetrapropylammonium fluoride, and tetrabutylammonium fluoride. From the viewpoint of decomposing cleaning performance, availability, prices, etc., it is preferable that the quaternary alkylammonium fluoride be tetrabutylammonium fluoride (TBAF).

The content of the quaternary alkylammonium fluoride in the composition is preferably 0.01 to 10% by mass. The "content of the quaternary alkylammonium fluoride" is a value converted as a mass of only the quaternary alkylammonium fluoride, excluding the mass of hydrate water, when a hydrate of the quaternary alkylammonium fluoride is contained in the composition. The content of the quaternary alkylammonium fluoride in the composition is more preferably 1 to 10% by mass, still more preferably 3 to 7% by mass, and particularly preferably 4 to 6% by mass. By setting the content of the quaternary alkylammonium fluoride to 0.01% by mass or more, an adhesive polymer can be effectively decomposed and cleaned, and by setting the content to 10% by mass or less, corrosion of a metal portion included in a device forming surface of a device wafer can be prevented or suppressed.

<Aprotic Solvent>

The composition comprises the (A) N-substituted amide compound having no active hydrogen on a nitrogen atom, and (B) dipropylene glycol dimethyl ether, as an aprotic solvent.

The content of the aprotic solvent in the composition is preferably 80 to 99.98% by mass, more preferably 85 to 99.95% by mass, and still more preferably 90 to 99.9% by mass.

[(A) N-Substituted Amide Compound Having No Active Hydrogen on Nitrogen Atom]

The (A) N-substituted amide compound having no active hydrogen on a nitrogen atom (also simply referred to as "(A) N-substituted amide compound") is an aprotic solvent having a relatively high polarity, and able to uniformly dissolve or disperse the quaternary alkylammonium fluoride and a hydrate thereof in the composition. In one embodiment, "(A) N-substituted amide compound" also encompasses a urea compound (carbamide compound) having no active hydrogen on a nitrogen atom. As the (A) N-substituted amide compound, various compounds can be used without particular limitation, and examples thereof include acyclic N-substituted amides, such as N,N-dimethylformamide (DMF), N,N-diethylformamide, N,N-dimethylacetamide, N,N-diethylacetamide, N,N-dimethylpropionamide, N,N-diethylpropionamide, and tetramethylurea; and cyclic N-substituted amides, such as 2-pyrrolidone derivatives, 2-piperidone derivatives, ε-caprolactam derivatives, 1,3-dimethyl-2-imidazolidinone (DMI), 1-methyl-3-ethyl-2-imidazolidinone, 1,3-diethyl-2-imidazolidinone, and 1,3-dimethyl-3,4,5,6-tetrahydro-2(1H)-pyrimidinone (N,N'-dimethylpropyleneurea). Among these, the (A) N-substituted amide compound is preferably a cyclic N-substituted amide. The (A) N-substituted amide compound may be one or a combination of two or more thereof.

In one embodiment, the (A) N-substituted amide compound is a 2-pyrrolidone derivative compound represented by the formula (1):

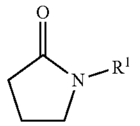

(1)

wherein, in the formula (1), $R^1$ represents an alkyl group having 1 to 4 carbon atoms. Examples of the alkyl group having 1 to 4 carbon atoms include a methyl group, an ethyl group, an n-propyl group, an isopropyl group, an n-butyl group, an isobutyl group, a sec-butyl group, and a t-butyl group. Examples of the 2-pyrrolidone derivative compound represented by the formula (1) include N-methylpyrrolidone (NMP), N-ethylpyrrolidone (NEP), N-propylpyrrolidone, and N-butylpyrrolidone.

The (A) N-substituted amide compound is preferably a 2-pyrrolidone derivative compound in which $R^1$ is a methyl group or an ethyl group in the formula (1), and more preferably a 2-pyrrolidone derivative compound in which $R^1$ is a methyl group in the formula (1), i.e., N-methylpyrrolidone, since they have relatively high polarity and excellent dissolving ability of the quaternary alkylammonium fluoride, and are easily available.

The content of the N-substituted amide compound in the aprotic solvent is preferably 50 to 95% by mass, more preferably 60 to 95% by mass, and still more preferably 70 to 90% by mass, with respect to 100% by mass of the aprotic solvent.

[(B) Dipropylene Glycol Dimethyl Ether]

By combining (B) dipropylene glycol dimethyl ether (DPGDME) with the (A) N-substituted amide compound, a mixed solvent system exhibiting high affinity for an adhesive surface can be formed. A composition using such a mixed solvent system can achieve a high etch rate in which the reaction activity of the quaternary alkylammonium fluoride is effectively utilized.

The content of the dipropylene glycol dimethyl ether in the aprotic solvent is preferably 5 to 50% by mass, more preferably 5 to 40% by mass, and still more preferably 10 to 30% by mass, with respect to 100% by mass of the aprotic solvent.

[Additional Aprotic Solvent]

The composition may comprise an additional aprotic solvent other than the (A) N-substituted amide compound and (B) dipropylene glycol dimethyl ether. Examples of the additional aprotic solvent include dialkyl ethers of glycol, such as ethylene glycol dimethyl ether, propylene glycol dimethyl ether, diethylene glycol dimethyl ether, tripropylene glycol dimethyl ether, tripropylene glycol diethyl ether, tripropylene glycol di(n-butyl) ether, tetraethylene glycol dimethyl ether, and tetrapropylene glycol dimethyl ether, and dialkyl ethers, such as dibutyl ether, dipentyl ether, dihexyl ether, diheptyl ether, dioctyl ether, butyl hexyl ether, and butyl octyl ether.

The flash point of the additional aprotic solvent is preferably 21° C. or higher. The use of the additional aprotic solvent having a flash point of 21° C. or higher, i.e., which is not applicable to hazardous materials, Category 4, Class 1 petroleums, can reduce the requirements for equipment, work environment, etc., in the production and use of the composition. For example, the flash points of diethylene glycol dimethyl ether, and dibutyl ether are 51° C., and 25° C., respectively. Incidentally, the flash point of dipropylene glycol dimethyl ether is 60° C. The flash point is measured by the tag closed cup method (JIS K 2265-1:2007).

The content of the additional aprotic solvent in the aprotic solvent is preferably 10% by mass or less, more preferably 5% by mass or less, and still more preferably 1% by mass or less, with respect to 100% by mass of the aprotic solvent. In one embodiment, the aprotic solvent is free of the additional aprotic solvent, i.e., consists of the (A) N-substituted amide compound and (B) dipropylene glycol dimethyl ether.

<Antioxidant>

An antioxidant prevents the N-substituted amide compound in a solvent from being air oxidized to produce an oxide. The type of the antioxidant is not particularly limited, and examples thereof include dibutylhydroxytoluene (BHT), butylhydroxyanisole (BHA), ascorbic acid and derivatives thereof, tocopherols and derivatives thereof, and sodium erythorbate. These antioxidants are excellent in solubility in an aprotic solvent, and can also act as an antioxidant for (B) dipropylene glycol dimethyl ether and other ethers. The antioxidant may be used alone or in combination of two or more thereof. From the viewpoint of availability, prices, etc., the antioxidant is preferably at least one selected from the group consisting of dibutylhydroxytoluene (BHT), butylhydroxyanisole (BHA), and ascorbic acid, and more preferably dibutylhydroxytoluene (BHT).

The content of the antioxidant in the composition is preferably 10 ppm by mass to 1,000 ppm by mass. The content of the antioxidant in the composition is more preferably 10 ppm by mass to 500 ppm by mass, still more preferably 20 ppm by mass to 200 ppm by mass, and particularly preferably 30 ppm by mass to 100 ppm by mass. By setting the content of the antioxidant within the above ranges, a decrease in etch rate with time can be more effectively suppressed. By setting the content of the antioxidant to 1,000 ppm by mass or less, it is possible to retain an initial etch rate equivalent to that in the case where the antioxidant is not used and to suppress coloring of the composition caused by the antioxidant or a reaction product thereof.

<Additives and Other Ingredients>

The composition may contain, as an optional component, additives, such as a surfactant, a preservative, and an antifoaming agent, within a range not significantly impairing the effect of the present invention.

In one embodiment, the composition is substantially free or free of a protic solvent. For example, the content of the protic solvent in the composition may be 5% by mass or less, 3% by mass or less, or 1% by mass or less. The protic solvent that may be contained in the composition may be water derived from the hydrate of the quaternary alkylammonium fluoride.

In one embodiment, the composition is substantially free or free of an aprotic solvent selected from ketones and esters. For example, the content of the aprotic solvent selected from ketones and esters in the composition may be 1% by mass or less, 0.5% by mass or less, or 0.1% by mass or less. In this embodiment, deactivation of fluoride ions due to solvation of a reaction product (an aldol self-condensation product) or a decomposition product (an alcohol and a carboxylic acid) generated from a ketone or an ester in the presence of the fluorine compound is suppressed, and a decrease in the etch rate with time can be suppressed.

A composition according to one embodiment can be used as a decomposing cleaning composition of an adhesive polymer contained in various adhesives. The adhesive polymer is not particularly limited as long as it can be cleaned by using a composition according to one embodiment. In addition to the adhesive polymer, the adhesive may contain, as an optional component, a curing agent, a curing accelerator, a crosslinking agent, a surfactant, a leveling agent, a filler, etc.

<Adhesive Polymer>

In one embodiment, the adhesive polymer includes an Si—O bond. The adhesive polymer is reduced in molecular weight or loses its crosslinked structure due to cleavage of an Si—O bond by a fluoride ion of the quaternary alkylammonium fluoride, so that it can be dissolved in the aprotic solvent, and as a result, the adhesive polymer can be removed from a surface, such as that of a device wafer.

The adhesive polymer including an Si—O bond is preferably a polyorganosiloxane compound. Since the polyorganosiloxane compound includes a large number of siloxane bonds (Si—O—Si), it can be effectively decomposed and cleaned by using the composition. Examples of the polyorganosiloxane compound include silicone elastomers, silicone gels, and silicone resins, such as MQ resins, and modified products thereof, such as epoxy-modified products, acrylic-modified products, methacrylic-modified products, amino-modified products, and mercapto-modified products thereof. The polyorganosiloxane compound may be a silicone-modified polymer, such as a silicone-modified polyurethane, and a silicone-modified acrylic resin.

In one embodiment, the adhesive polymer is an addition-curable silicone elastomer, a silicone gel, or a silicone resin. These addition-curable silicones contain an ethylenically unsaturated group-containing polyorganosiloxane, such as a vinyl-terminated polydimethylsiloxane or a vinyl-terminated MQ resin, and a polyorganohydrosiloxane, such as a polymethylhydrosiloxane, as a crosslinking agent, and are cured by using a hydrosilylation catalyst, such as a platinum catalyst.

In another embodiment, the adhesive polymer includes an aralkyl group-, epoxy group-, or phenyl group-containing polydiorganosiloxane, in particular, an aralkyl group-, epoxy group-, or phenyl group-containing polydimethylsiloxane. An adhesive containing such an adhesive polymer may be used for temporary bonding, in combination with an adhesive containing the addition-curable silicone described above.

[Method for Cleaning Adhesive Polymer]

Cleaning of an adhesive polymer on a substrate, such as a silicon wafer, can be carried out in various conventionally known methods using the composition. A method for cleaning an adhesive polymer includes, for example, discharging the composition onto a substrate so that the composition contacts an adhesive polymer while rotating the substrate at a predetermined speed using a spin coater, etc., (spin etch), spraying the composition onto an adhesive polymer on a substrate (spraying), or immersing a substrate having thereon an adhesive polymer in a tank containing the composition (dipping). The temperature of the decomposing cleaning may vary depending on the type of the adhesive polymer and the deposited amount thereof on the substrate, and is generally 20° C. to 90° C., and preferably 40° C. to 60° C. The time of the decomposing cleaning may vary depending on the type of the adhesive polymer and the deposited amount thereof on the substrate, and is generally 5 seconds to 10 hours, and preferably 10 seconds to 2 hours. During the decomposing cleaning, ultrasonic may be applied to a bath of the composition or the substrate.

After the decomposing cleaning, the substrate may be rinsed using an alcohol, such as isopropyl alcohol (IPA), or ion-exchanged water (DIW), and the substrate may be dried by spraying with nitrogen gas, air, etc., or heating under normal pressure or under reduced pressure, etc.

[Method for Producing Device Wafer]

In one embodiment, a method for producing a device wafer includes cleaning an adhesive polymer on a device wafer by using the composition. After cleaning, the device wafer may be rinsed or dried as necessary.

A method for producing a device wafer may further include: forming a semiconductor device on a substrate, such as a silicon wafer, to obtain a device wafer; opposing a surface of the device wafer on which the semiconductor device is formed and a support wafer to temporarily bond the device wafer and the support wafer via an adhesive containing an adhesive polymer; thinning the device wafer by polishing a surface (back surface) opposite the surface of the device wafer on which the semiconductor device is formed; and separating the support wafer from the device wafer. Formation of the semiconductor device, temporary bonding of the device wafer and the support wafer, polishing of the back surface of the device wafer, and separation of the device wafer from the support wafer can be carried out in conventionally known methods and are not particularly limited.

[Method for Regenerating Support Wafer]

The composition can be used to regenerate a support wafer used in the manufacture of a device wafer. In one embodiment, a method for regenerating a support wafer includes cleaning an adhesive polymer on a support wafer by using the composition. After cleaning, the support wafer may be rinsed or dried as necessary.

EXAMPLES

Hereinafter, the present invention will be described in more detail based on the Examples, but the present invention is not limited by the Examples.

Example 1

Preparation of Composition Comprising Antioxidant (BHT)

To a 125 mL polyethylene container, 3.332 g of tetrabutylammonium fluoride trihydrate (TBAF·$3H_2O$), and 0.0030 g of dibutylhydroxytoluene (BHT) (Tokyo Chemical Industry Co., Ltd.) were added, and then 38.934 g of N-methylpyrrolidone (NMP), and 12.017 g of dipropylene glycol dimethyl ether (DPGDME) (Nippon Nyukazai Co., Ltd.) were added in this order and mixed to dissolve TBAF·$3H_2O$. In this way, a composition of 5% by mass TBAF mixed solvents was prepared in which 55 ppm by mass of BHT was contained, and the mass ratio of NMP:DPGDME was 0.764:0.236. In the same manner as above, 0.0059 g or 0.0291 g of BHT was added to prepare a composition of 5% by mass TBAF mixed solvents in which 109 ppm by mass or 536 ppm by mass of BHT was contained, and the mass ratio of NMP:DPGDME was 0.764:0.236.

Comparative Example 1

A composition of 5% by mass TBAF mixed solvents in which the mass ratio of NMP:DPGDME was 0.764:0.236 was prepared in the same manner as in Examples 1 except that no BHT was used.

Cleaning Test

A 12 inch (300 mm) silicon wafer (770 μm thick) was divided into a size of 1.5 cm×1.5 cm.

An adhesive obtained by mixing 2.1484 g of a main agent of SYLGARD (trademark) 184 (manufactured by DuPont Toray Specialty Materials K. K.) and 0.2137 g of a curing agent was sucked out by a Pasteur pipette, and one drop was placed onto the divided silicon wafer. Thereafter, the silicon wafer was heated in a dryer at 125° C. for 20 minutes to form an adhesive layer on the silicon wafer. This was made to be a test piece, and the thickness of the central portion of the test piece was measured using a micrometer.

A screw tube bottle having a volume of 50 cc was placed on top of a magnetic stirrer. The screw tube bottle was charged with 15.0 mL of the composition immediately after preparation (within 30 minutes after preparation) and a stirrer. One test piece was immersed in the composition, and the stirrer was rotated at a rotation speed of 900 rpm for 5 minutes at room temperature (25° C.). After the immersion, the test piece was removed by using tweezers and thoroughly rinsed by using an isopropyl alcohol (IPA) wash bottle. Thereafter, the test piece was thoroughly rinsed using an ion-exchanged water (DIW) wash bottle in the same manner. After spraying nitrogen gas to the test piece to dry the water attached to the test piece, the thickness of the center portion of the test piece was measured using a micrometer. The value obtained by dividing the difference in the thicknesses of the test piece before and after immersion by 5 (min) was taken as the etch rate (ER). Similar tests were also carried out on days 7, 14, and 25 after the composition was prepared.

The etch rates of Example 1 and Comparative Example 1 were determined, and the results are shown in Table 1.

TABLE 1

| | Content of antioxidant | ER (μm/min) | | | |
|---|---|---|---|---|---|
| | (ppm by mass) | Day 0 | Days 7 | Days 14 | Days 25 |
| Comparative Example 1 | 0 | 12.0 | 8.4 | 7.4 | 5.0 |
| Example 1 | 55 | 11.4 | 10.4 | 9.8 | 7.6 |
| (BHT) | 109 | 11.0 | 10.4 | 9.4 | 7.0 |
| | 536 | 11.0 | 10.0 | 9.4 | 6.8 |

Example 2

Preparation of Composition Comprising Antioxidant (BHA)

To a 125 mL polyethylene container, 3.332 g of tetrabutylammonium fluoride trihydrate (TBAF·$3H_2O$), and 0.03054 g of butylhydroxyanisole (BHA) (Kanto Chemical Co., Inc.) were added, and then 38.957 g of N-methylpyrrolidone (NMP), and 12.156 g of DPGDME (Nippon Nyukazai Co., Ltd.) were added in this order and mixed to dissolve TBAF-$3H_2O$. In this way, a composition of 5% by mass TBAF mixed solvents was prepared in which 560 ppm by mass of BHA was contained, and the mass ratio of NMP:DPGDME was 0.764:0.236. In the same manner as above, 0.00335 g or 0.00654 g of BHA was added to prepare a composition of 5% by mass TBAF mixed solvents in which 55 ppm by mass or 108 ppm by mass of BHA was contained, and the mass ratio of NMP:DPGDME was 0.764:0.236.

Example 3

Preparation of Composition Comprising Antioxidant (Ascorbic Acid)

In the same manner as in Example 2, 0.02998 g of L-(+)-ascorbic acid (Kanto Chemical Co., Ltd.) was added to prepare a composition of 5% by mass TBAF mixed solvents in which 500 ppm by mass of L-(+)-ascorbic acid was contained, and the mass ratio of NMP:DPGDME was 0.764:0.236. In the same manner as above, 0.00360 g or 0.00597 g of L-(+)-ascorbic acid was added to prepare a composition of 5% by mass TBAF mixed solvents in which 57 ppm by mass or 99 ppm by mass of L-(+)-ascorbic acid was contained, and the mass ratio of NMP:DPGDME was 0.764:0.236.

The etch rates of Examples 2 and 3 were determined in the same manner as in Example 1, and the results are shown in Table 2.

TABLE 2

| | Content of antioxidant | ER (μm/min) | | |
|---|---|---|---|---|
| | (ppm by mass) | Day 0 | Days 7 | Days 14 |
| Example 2 | 55 | 11.6 | 10.8 | 10.2 |
| (BHA) | 108 | 10.4 | 9.8 | 9.6 |
| | 560 | 10.4 | 9.4 | 9.0 |

TABLE 2-continued

| | Content of antioxidant | ER (μm/min) | | |
|---|---|---|---|---|
| | (ppm by mass) | Day 0 | Days 7 | Days 14 |
| Example 3 (Ascorbic acid) | 57 | 11.4 | 10.0 | 7.6 |
| | 99 | 11.8 | 9.6 | 9.0 |
| | 500 | 10.2 | 8.6 | 8.0 |

INDUSTRIAL APPLICABILITY

The composition according to the present invention can be suitably used for applications in which a residue of an adhesive used in a thinning process of a semiconductor wafer, in particular, an adhesive including a polyorganosiloxane compound as an adhesive polymer, on a device wafer is decomposed and cleaned.

The invention claimed is:

1. A composition comprising at least one selected from a quaternary alkylammonium fluoride or a hydrate of a quaternary alkylammonium fluoride; (A) an N-substituted amide compound having no active hydrogen on a nitrogen atom, and (B) dipropylene glycol dimethyl ether, as an aprotic solvent; and an antioxidant, wherein the antioxidant comprises at least one selected from the group consisting of dibutylhydroxytoluene (BHT) and butylhydroxyanisole (BHA), and wherein the content of the antioxidant is 55 ppm by mass to 1,000 ppm by mass.

2. The composition according to claim 1, wherein the (A) N-substituted amide compound is a 2-pyrrolidone derivative compound represented by the formula (1):

(1)

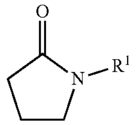

wherein, in the formula (1), $R^1$ represents an alkyl group having 1 to 4 carbon atoms.

3. The composition according to claim 2, wherein the (A) N-substituted amide compound is a 2-pyrrolidone derivative compound wherein $R^1$ in the formula (1) is a methyl group or an ethyl group.

4. The composition according to claim 1, wherein the content of the quaternary alkylammonium fluoride is 0.01 to 10% by mass.

5. The composition according to claim 1, wherein the quaternary alkylammonium fluoride is a tetraalkylammonium fluoride represented by the formula (2):

$$R^2R^3R^4R^5N^+F^- \quad (2)$$

wherein, in the formula (2), $R^2$ to $R^5$ each independently represent an alkyl group selected from the group consisting of a methyl group, an ethyl group, an n-propyl group, an isopropyl group, and an n-butyl group.

6. The composition according to claim 1, wherein the content of the (A) N-substituted amide compound is 50 to 95% by mass and the content of (B) dipropylene glycol dimethyl ether is 5 to 50% by mass, with respect to 100% by mass of the aprotic solvent.

7. The composition according to claim 1, which is a decomposing cleaning composition for an adhesive polymer.

8. The composition according to claim 7, wherein the adhesive polymer is a polyorganosiloxane compound.

9. A method for cleaning an adhesive polymer on a substrate by contacting the substrate with the composition according to claim 1.

* * * * *